(12) United States Patent
Iyechika et al.

(10) Patent No.: US 6,617,235 B2
(45) Date of Patent: Sep. 9, 2003

(54) METHOD OF MANUFACTURING GROUP III-V COMPOUND SEMICONDUCTOR

(75) Inventors: Yasushi Iyechika, Tsukuba (JP); Yoshinobu Ono, Tsukuba-gun (JP); Tomoyuki Takada, Tsukuba (JP)

(73) Assignee: Sumitomo Chemical Company, Limited, Osaka (JP)

( * ) Notice: Subject to any disclaimer, the term of this patent is extended or adjusted under 35 U.S.C. 154(b) by 0 days.

(21) Appl. No.: 08/623,534

(22) Filed: Mar. 29, 1996

(65) Prior Publication Data

US 2002/0045340 A1 Apr. 18, 2002

(30) Foreign Application Priority Data

Mar. 30, 1995 (JP) ............................................... 7-073318

(51) Int. Cl.$^7$ ................ H01L 21/3205; H01L 21/4763; C30B 23/00
(52) U.S. Cl. .................... 438/604; 438/285; 438/590; 438/478; 438/930; 438/648; 117/90; 117/94; 117/97; 117/102; 117/104; 117/106; 117/952
(58) Field of Search ............................. 117/952, 90, 94, 117/97, 102, 104, 106; 438/648, 604, 590, 478, 285, 930

(56) References Cited

U.S. PATENT DOCUMENTS

| | | | | |
|---|---|---|---|---|
| 4,894,832 A | * | 1/1990 | Colak | 372/44 |
| 5,168,077 A | * | 12/1992 | Ashizawa | 437/107 |
| 5,306,662 A | | 4/1994 | Nakamura et al. | 437/107 |
| 5,587,014 A | * | 12/1996 | Iyechika | 117/90 |

FOREIGN PATENT DOCUMENTS

| | | |
|---|---|---|
| EP | 0541373 A2 | 5/1993 |
| JP | 3218625 | 9/1991 |
| JP | 5183189 | 7/1993 |
| JP | 5198841 | 8/1993 |
| JP | 6232451 | 8/1994 |
| JP | 6-232451 * | 8/1994 |
| WO | WO9216966 | 10/1992 |

OTHER PUBLICATIONS

Hardtdegen H et al. Journal of Crystal Growth, 145, pp. 440–446, 1994.*
"P–Type Conduction in Mg–Doped GaN Treated with Low–Energy Electron Beam Irradiation (LEEBI)", by H. Amano et al., Japanese Journal of Applied Physics, vol. 28, No. 12, Dec. 1989 pp. L2112–L2114.

(List continued on next page.)

Primary Examiner—Evelyn Mei Huang
(74) Attorney, Agent, or Firm—Birch, Stewart, Kolasch & Birch, LLP

(57) ABSTRACT

The present invention provides for a method of manufacturing a Group III-V compound semiconductor, which grows a nitrogen-contained Group III-V compound semiconductor of the p-type conductivity, without performing any particular post-processing after growing the compound semiconductor, and which prevents a deterioration in the yield of manufacturing light emitting elements due to post-processing. A first embodiment is directed to a method of manufacturing a Group III-V compound semiconductor which contains p-type impurities and which is expressed by a general formula $In_xGa_yAl_zN$ ($0 \geq x \geq 1, 0 \geq z \geq 1$, $x+y+z=1$), by thermal decomposition vapor phase method using metalorganics, the method being characterized in that carrier gas is inert gas in which the concentration of hydrogen is 0.5 % or smaller by volume. A second embodiment is directed to a method of manufacturing a Group III-V compound semiconductor which contains p-type impurities and which is expressed by a general formula $In_xGa_yAl_zN$ ($0 \geq x \geq 1, 0 \geq y \geq 1, 0 \geq 1$, $x+y+z=1$), by thermal decomposition vapor phase method using metalorganics, the method being characterized in that after etching within a reaction furnace using at least one compound which is selected from a compound group consisting of compounds of halogenated hydrogen, compounds of halogen and Group V elements and compounds of halogen, hydrogen and Group V elements, inert gas in which the concentration of hydrogen is 0.5% or smaller by volume is used as carrier gas.

14 Claims, 3 Drawing Sheets

OTHER PUBLICATIONS

"Thermal Annealing Effects on P–Type Mg–Doped GaN Films" by S. Nakamura et al., Japanese Journal of Applied Physics, vol. 31 (1992) Part 2, No. 2B, Feb. 15, 1992, pp. L139–L142.

"Hole Compensation Mechanism of P–Type GaN Films" by S. Nakamura et al., Japanese Journal of Applied Physics, vol. 31 (1992) Part 1, No. 5A May 1192 pp. 1258–1266.

"H–Atom Incorporation in Mg–Doped GaN Grown by Metalorganic Chemical Vapor Deposition", by Y. Ohba et al., Japanese Journal of Applied Physics, vol. 33 (1994) Part 2, No.1 10A Oct. 1, 1994 pp. L1367–L1369.

"Growth and Doping of GaN Films by ECR–Assisted MBE" by T.Moustakas et al., Mat. Res. Soc. Symp. Proc. vol. 281 pp. 753–763.

"Metalorganic vapor phase epitaxy growth and characteristics of Mg–doped GaN using GaN substrates" by T. Detchprohm et al., Journal of Crystal Growth 145 (1994) pp. 192–196.

* cited by examiner

METHOD OF MANUFACTURING GROUP III-V COMPOUND SEMICONDUCTOR

BACKGROUND OF THE INVENTION

1. Field of the Invention

The present invention is related to a method of manufacturing a Group III-V compound semiconductor by thermal decomposition vapor phase method using metalorganics.

2. Description of the Background Art

Since Group III-V compound semiconductors which are expressed by a general formula $In_xGa_yAl_zN$ ($0 \geq x \geq 1$, $0 \geq z \geq 1$, x+y+z=1) have a band gap which can be controlled by the composition of Group III elements, Group III-V compound semiconductors can be used as a light emitting element which emits light ranging from the visible range to the ultraviolet range. In addition, since Group III-V compound semiconductors have a band structure of the direct transition type, using a Group III-V compound semiconductor, it is possible to obtain a light emitting element which has a high luminescence efficiency. Group III-V compound semiconductors in which the concentration of In is 10% or more, in particular, are important for display applications, since the violet range or the longer visible wavelength range can be used as an emission wavelength.

A popular method of manufacturing Group III-V compound semiconductors is molecular beam epitaxy (hereinafter abbreviated as "MBE" in some cases), metalorganic vapor phase epitaxy (hereinafter abbreviated as "MOVPE" in some cases), etc. The MOVPE method is a method in which material gas is sprayed onto a heated substrate together with carrier gas so as to grow crystal due to thermal decomposition of the materials. Allowing crystals to grow uniformly over a wide area at a high accuracy, this method is industrially important as a manufacturing method. In the MOVPE method, hydrogen is often used as carrier gas since hydrogen is cheap gas with a high purity. This is because very pure hydrogen is relatively easily obtained by passing hydrogen through a palladium film.

Further, to efficiently inject a current into a semiconductor light emitting element with a low applied voltage, a p-type semiconductor and an n-type semiconductor are generally used as a current injection layer for holes and a current injection layer for electrons, respectively. However, in such a compound semiconductor manufactured by MOVPE, it is known that it is difficult to control the p-type conductivity while it is relatively easy to control the n-type conductivity. That is, even if doped with p-type impurities, the compound semiconductor has a high resistance. In general, therefore, the compound semiconductor is processed after grown, by electron beam irradiation, thermal annealing, etc., so that the compound semiconductor of the p-type conductivity has a low resistance.

Hence, while it is essential to perform such post-processing to manufacture an element which has a high current injection characteristic, such post-processing unavoidably deteriorates the yield. Moreover, a layer which contains the p-type impurities needs be located at the top and the layer must not be thick to render the post-processing effective, which serves as a restraint to the structure of the element.

Japanese Patent KOKAI (Laid-open) No. 6-232451 discloses that it is possible to grow p-type GaN, without performing any special post-processing, if grown by a method in which material gas is pressed against a substrate by second carrier gas which is blown from a direction which is perpendicular to a direction of supplying the material gas (hereinafter abbreviated as "TFMOCVD" in some cases). Still, this method aims at growing Mg-doped GaN on InGaN which was already grown, and therefore, the Mg-doped GaN does not exhibit the p-type conductivity if an InGaN layer is not used, according to the gazette.

Accordingly, an object of the present invention is to provide for a method of manufacturing a Group III-V compound semiconductor, which grows a nitrogen-contained Group III-V compound semiconductor of the p-type conductivity, without performing any particular post-processing after growing the compound semiconductor, and which prevents a deterioration in the yield of manufacturing light emitting elements due to post-processing.

SUMMARY OF THE INVENTION

Having studied the problems above and found that when inert gas other than hydrogen is mainly used as carrier gas, a compound semiconductor which contains p-type impurities exhibits the p-type conductivity even if the semiconductor is not processed by any particular post-processing, the inventors have arrived at the present invention. In other words, the present invention is related to the following:

[1] A method of manufacturing a Group III-V compound semiconductor which contains p-type impurities and which is expressed by a general formula $In_xGa_yAl_zN$ ($0 \geq x \geq 1,0 \geq y \geq 1,0 \geq z \geq 1$,x+y+z=1), by thermal decomposition vapor phase method using metalorganics, the method being characterized in that carrier gas is inert gas in which the concentration of hydrogen is 0.5% or smaller by volume.

[2] A method of manufacturing a Group III-V compound semiconductor which contains p-type impurities and which is expressed by a general formula $In_xGa_yAl_zN$ ($0 \geq x \geq 1,0 \geq y \geq 1,0 \geq z \geq 1$, x+y+z=1), by thermal decomposition vapor phase method using metalorganics, the method being characterized in that after etching within a reaction furnace using at least one compound which is selected from a compound group consisting of compounds of halogenated hydrogen, compounds of halogen and Group V elements, and compounds of halogen, hydrogen and Group V elements, inert gas in which the concentration of hydrogen is 0.5% by volume is used as carrier gas.

[3] The method of manufacturing a Group III-V compound semiconductor as described in the paragraph [1] or [2], characterized in that when there are two or more inlets for introducing carrier gas and/or material gas, the maximum angle between any two of the inlets and any point on the substrate is 80 degrees or smaller.

[4] The method of manufacturing a Group III-V compound semiconductor as described in the paragraph [1],[2] or [3], characterized in that the concentration of hydrogen is maintained at 0.5% or smaller by volume in the atmosphere, during a reduction in the temperature of a Group III-V compound semiconductor after the Group III-V compound semiconductor is grown.

Now, the present invention will be described in detail.

In the present invention, the gas contains 0.5% of or less hydrogen by volume. If the carrier gas contains more than 0.5% of hydrogen by volume, the p-type conductivity is not good enough, which is not desirable. Reducing the concentration of hydrogen in the carrier gas, the larger p-type carrier concentration and hence the better characteristics as a p-type semiconductor are achieved. A preferable concentration of hydrogen is 0.3% or less, more preferably, 0.1% or less, and most preferably, 0.04% or less.

Further, even if carrier gas which does not contain hydrogen is used while growing a semiconductor, the semiconductor may not exhibit the p-type conductivity in some cases if the atmosphere contains hydrogen while the semiconductor is cooled down. Hence, the concentration of hydrogen in the atmosphere during cooling down is preferably low. Reducing the concentration of hydrogen in the atmosphere, the larger p-type carrier concentration and hence the better characteristics as a p-type semiconductor are achieved. A preferable concentration of hydrogen is 0.3% or less, more preferably, 0.1% or less, and most preferably, 0.04% or less.

In general, a compound semiconductor grows at a high temperature such as 800° C. or more, and therefore, it is desirable to add Group V materials such as ammonia into the carrier gas while the temperature is not sufficiently lowered yet after growing the semiconductor, so as to suppress decomposition of the semiconductor due to heat. For this purpose, a preferable concentration range of Group V material in the growth atmosphere is 0.1% to 95%.

The inert gas, which mainly forms the carrier gas, is preferably helium gas, argon gas, nitrogen gas or a mixture of these, taking into consideration the chemical stability. Nitrogen is particularly preferable since highly pure nitrogen is relatively easily obtainable.

If the carrier gas according to the present invention is used from the beginning of the growth of crystal, the quality of the crystal may deteriorate, with a surface of the crystal not completed as a mirror surface or other problem. To deal with this, hydrogen gas may be used as carrier gas, first, to grow a compound semiconductor which has a high crystal perfection, and the carrier gas according to the present invention may be then used to grow a p-type layer, so that a layer with a high crystal perfection is formed.

Regarding the reaction furnace according to the present invention, while there is no problem when there is only one common inlet in the reaction furnace for introducing the carrier gas and the material gas (e.g., the example shown in FIG. 1), when there are two or more inlets for introducing the carrier gas and/or the material gas, it is preferable that the maximum angle between any two of the inlets and an optional point on a substrate is 80 degrees or smaller. More preferably, the maximum angle is 70 degrees or smaller. For instance, in FIG. 2, of five inlets for introducing the carrier gas and the material gas, angles between any two of the inlets and an optional point on a substrate may be β and α. In this case, β<α. The maximum one of the angles between any two of the inlets and the optional point on the substrate corresponds to α, and αis preferably 80 degrees or smaller.

The angle between the direction of the inlet for introducing the carrier gas and the substrate surface is preferably 3 degrees or larger, or more preferably, 10 degrees or larger.

While the direction in which the material gas is supplied within the reaction furnace may be a direction from above to below, a horizontal direction, etc., in general, the direction of supplying may be a slanted direction or a direction from below to above.

When mixed with each other, Group V materials and Group III materials may produce an adduct with a low vapor pressure, resulting in a deterioration in the crystal perfection such as a deterioration in the surface morphology. To deal with such a case, Group V materials and Group III materials may be introduced through different pipes immediately until they are supplied onto the substrate and mixed with each other immediately before supplied onto the substrate, so that creation of an adduct is suppressed.

Further, in the present invention, it is desirable to etch the reaction furnace and the substrate by vapor phase etching before growing crystal, since such allows to grow high quality crystal with a good reproducibility. Etching gas may be a compound of halogenated hydrogen, a compound of halogen and Group V elements, or a compound of halogen, hydrogen and Group V elements. These materials may be used as they singularly are, or as they are mixed with each other. Of these materials, halogenated hydrogen, in particular, is preferable since halogenated hydrogen can be easily used. Hydrogen chloride is particularly preferable. If the etching gas is not very reactive with the substrate, the substrate may be etched when the reaction furnace is etched. Since this makes it possible to grow the semiconductor subsequently to etching, the compound semiconductor is grown with a good reproducibility, and almost without deteriorating the productivity.

The following materials can be used in the present invention. That is, materials of Group III elements include: triakylgallium which is expressed by a general formula $R_1R_2R_3Ga$ (where $R_1$, $R_2$ and $R_3$ denote lower alkyl groups) such as trimethylgallium [$Ga(CH_3)_3$, hereinafter abbreviated as "TMG" in some cases] and triethylgallium [$Ga(C_2H_5)_3$, hereinafter abbreviated as "TEG" in some cases]; triethylakylaluminum which is expressed by a general formula $R_1R_2R_3Al$ (the definitions of the symbols $R_1$, $R_2$ and $R_3$ are the same as above) such as trimethylaluminum [$Al(CH_3)_3$], triethylaluminum [$Al(C_2H_5)_3$, hereinafter abbreviated as "TEA", in some cases], trisobutylaluminum [$Al(i-C_4H_9)_3$; trimethylaminealane [$AlH_3N(CH_3)_3$]; triethylakylindium which is expressed by a general formula $R_1R_2R_3In$ (the definitions of the symbols $R_1$, $R_2$ and $R_3$ are the same as above) such as trimethylindium [$In(CH_3)_3$, hereinafter abbreviated as "TMI"] and triethyindium [$In(C_2H_5)_3$]. These materials are used as they singularly are, or as they are mixed with each other.

Materials of Group V elements include ammonia or hydrazine, alklhydrazine such as methylhydrazine, 1, 1-dimethylhydrazine, 1-, 2-dimethylhydrazine. These substances are used as they singularly are, or as they are mixed. Since alkylhydrazine may pollute crystal with carbon, it is preferable to use ammonia, hydrazine, or to use ammonia and hydrazine as they are mixed together.

A p-type dopant may be Be, Mg, Zn, Cd, Hg, etc. Of these, Mg is particularly suitable for its high activation rate.

Zn materials may be alkylzinc which is expressed by a general formula $R_1R_2Zn$ [where $R_1$ and $R_2$ denote alkyl groups] such as dimethylzinc [$(CH_3)_2Zn$] and diethylzinc [$(C_2H_5)_2Zn$].

Mg materials may be biscyclopentadienyl magnesium [$(C_5H_5)_2Mg$, hereinafter abbreviated as "Cp$_2$Mg" in some cases], bismethylcyclopentadienyl magnesium [$(CH_3C_5H_4)_2Mg$], bisisopropylcyclopentadienyl magnesium [$(i-C_3H_7C_5H_4)_2Mg$], etc.

Cd materials may be alkylcadmium which is expressed by a general formula $R_1R_2Cd$ [where $R_1$ and $R_2$ denote alkyl groups] such as dimethylcadmium [$(CH_3)_2Cd$].

Be materials may be diethylberyllium [$(C_2H_5)_2Be$], bismethylcyclopentadienyl beryllium [$(CH_3C_5H_4)_2Be$], etc.

Hg materials may be alkylmercury which is expressed by a general formula $R_1R_2Hg$ [where $R_1$ and $R_2$ denote alkyl groups] such as dimethylmercury [$(CH_3)_2Hg$], diethylmercury [$(C_2H_5)_2Hg$].

Pressure to be applied during growth is preferably low, so as to realize such a velocity of flow with which a flow in the vicinity of a susceptor is not disturbed. Since In tends to be less incorporated as the pressure during growth becomes small, the pressure during growth is preferably large to a certain extent. To be specific, the pressure is preferably in the range between 1 atmospheric pressure and 1 Torr, and more preferably, in the range between 1 atmospheric pressure and 10 Torr.

A substrate for growing crystal used in the present invention may be a sapphire substrate, an SiC substrate, an Si substrate, a GaAs substrate, a ZnO substrate, etc. A sapphire substrate is particularly preferable, since a sapphire substrate grows a compound semiconductor with a very high crystal perfection as known in the art, when the semiconductor is grown by a two-step growth method which requires to grow a buffer layer on the substrate, first.

Substantially, the present invention does not need any post-processing to realize the p-type conductivity, and therefore, an element is manufactured through less manufacturing steps in the present invention than in other techniques, whereby the yield is improved. Further, while other techniques require the layer which contains the p-type impurities to be formed on the top so as to improve the efficiency of processing for realizing the p-type conductivity, such processing is not necessary in the present invention. Hence, there is no problem in fabricating an element even if the layer which contains the p-type impurities is formed on the substrate side to the active layer and the n-type current injection layer, which serves to reduce a restraint to the element structure.

Moreover, according to the present invention, it is possible to grow the active layer and the n-type layers at a low temperature after growing the p-type layer which has a sufficiently high carrier concentration at a high temperature. Hence, it is possible to grow the entire p-type layer without deteriorating the active layer, which in turn improves characteristics of a resultant element.

The color of emitted light from a light emitting element according to the present invention can be adjusted by a composition of Group III elements which are contained in the active layer. It is also possible to adjust the emission color, by doping the active layer with impurities. As impurities which alter the emission color when doped, Group II elements such as Be, Cd, Mg, Zn are suitable. Owing to its high luminescence efficiency, Zn is further preferable.

These and other objects, features, aspects and advantages of the present invention will become more apparent from the following detailed description of the present invention when taken in conjunction with the accompanying drawings.

DESCRIPTION OF THE PREFERRED EMBODIMENTS

Now, the present invention will be more specifically described, in relation to preferred embodiments and examples to be compared. The description below, however, is not intended to limit the present invention.

FIRST EMBODIMENT

Figure 1:
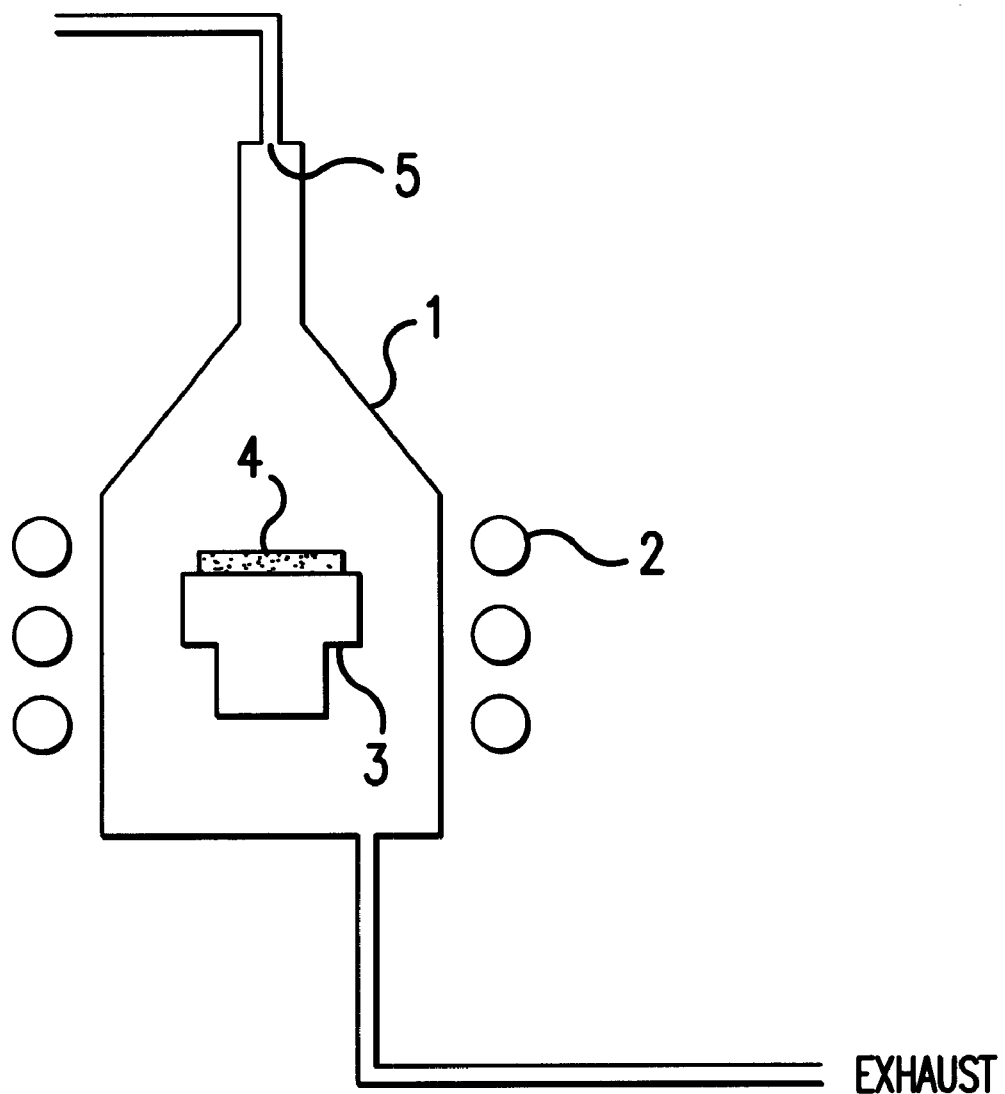
FIG. 1 is a schematic diagram of an apparatus which is used in a method of manufacturing a Group III-V compound semiconductor according to a first preferred embodiment of the present invention.
Figure 2:
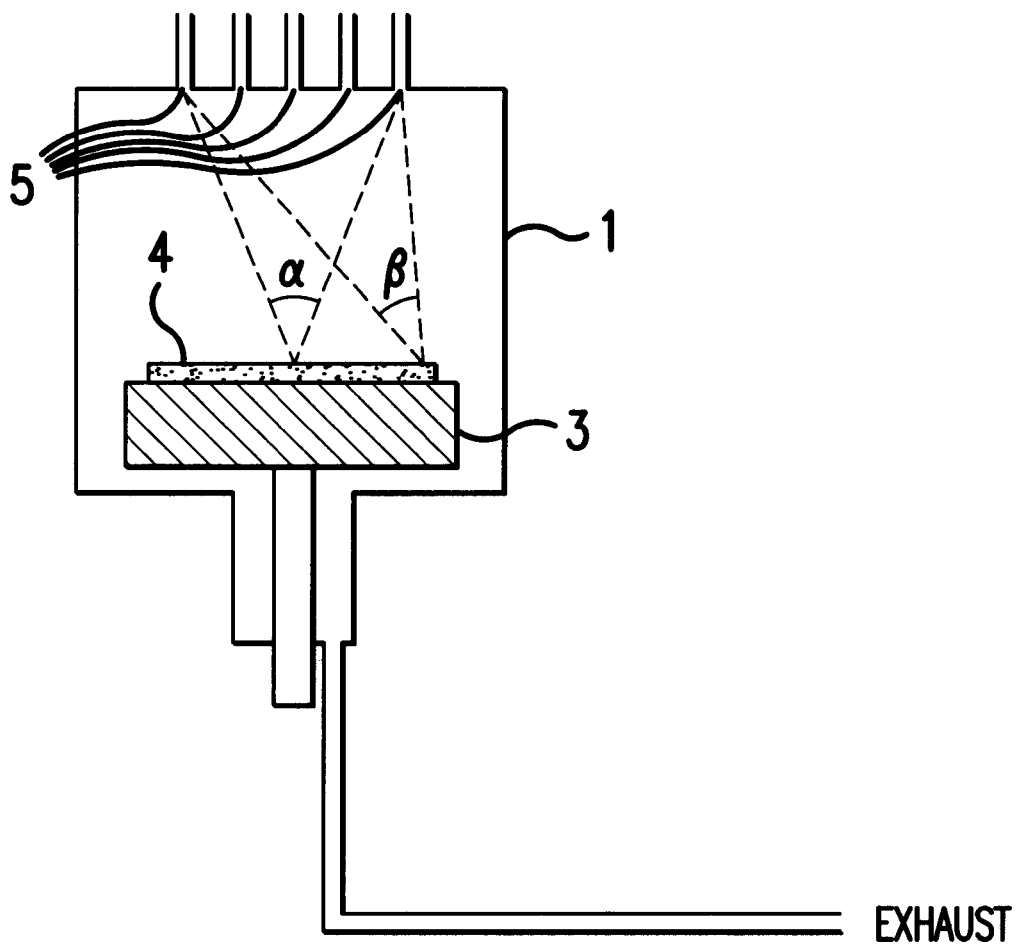
FIG. 2 is a schematic diagram of an apparatus which can be used in a method of manufacturing a Group III-V compound semiconductor according to the present invention.

FIG. 1 schematically shows the reaction furnace which is used to grow a structure. Materials are mixed before introduced into the reaction furnace, and sprayed from an upper portion of the reaction furnace down toward a substrate which is seated in a lower portion of the reaction furnace. HCl gas used for etching of the reaction furnace is supplied through an introduction pipe which is disposed separately from the supply pipes (not shown in FIG. 1) for supplying the materials. The substrate 4 is mounted on a carbon susceptor 3 which is heated by an external high frequency wave heating coil 2.

First, a monocrystal sapphire substrate, whose organically cleaned C-surface serves as a major surface, was set to the susceptor made of graphite and coated with SiC which is disposed within a reaction chamber of an MOVPE apparatus. Next, the susceptor was heated to 1,100° C. by high frequency wave, while flowing hydrogen into the reaction chamber at a flow rate of 2 SLM under normal pressure. 10 SCCM of HCl gas was then introduced into the reaction furnace under this condition, and the reaction furnace, the susceptor and the substrate were etched for 5 minutes. As herein termed, the symbols "SLM" and "SCCM" denote units expressing flow rates of gas. If the value is 1 SLM, it means that gas which flows per minute has such weight which measures 1 liter in cubic volume at 0° C. and under 1 atmospheric pressure. The quantity of 1 SLM is the quantity of 1,000 SCCM. After stopping the supply of HCl gas, the sapphire substrate was cleaned by vapor phase cleaning further for 5 minutes.

Next, the temperature was reduced to 600° C, and hydrogen was supplied at a flow rate of 2 SLM while supplying ammonia at a flow rate of 2 SLM and TMG at a rate of $6.7 \times 10^{-6}$ mol/min, thereby forming a GaN buffer layer to a thickness of about 500 Å. Following this, the supply of only TMG was stopped, and the sapphire substrate was heated to a temperature of 1,100° C. After stabilizing the temperature, the flow rate for supplying hydrogen was changed to 4 SLM, the flow rate for supplying ammonia was changed to 4 SLM, and supply of TMG was resumed at a rate of $9 \times 10^{-5}$ mol/min. The process was continued for 15 minutes in this state, whereby non-doped GaN was grown to a thickness of about 3 µm. The supply of TMG was suspended once at this point, and the carrier gas was switched from hydrogen to nitrogen of the same flow rate. Further, using nitrogen gas as carrier gas, supply of TMG was resumed at a rate of $4.5 \times 10^{-5}$ mol/min. At the same time, 100 SCCM of nitrogen gas was supplied into a $Cp_2Mg$ bubbler which is maintained at 30° C., and the bubbler was introduced into the MOVPE apparatus. This state was maintained for 30 minutes, thereby growing an Mg-doped GaN layer.

Next, the supply of TMG and $Cp_2Mg$ was stopped, and at the same time, heating by high frequency wave was stopped. When the temperature of the susceptor was reduced to 400° C., the supply of $NH_3$ was also stopped. Further, when the temperature of the susceptor was reduced to 100° C., the substrate was taken out. The GaN film which was grown in this manner had a mirror-like surface. During evaluation of this film by capacity measuring and photoelectromotive force, the film exhibited p-type conductivity of $2 \times 10^{18}/cm^3$ in terms of a carrier concentration.

First Example To Compare

A sample was manufactured in the same manner as in the first embodiment, except for points that hydrogen gas was used as the carrier gas through the entire steps and that the supply of $NH_3$ was stopped when the temperature of the susceptor was reduced to 600° C. Despite the effort to evaluate the sample in the same manner as in the first embodiment, it was impossible to evaluate the conductivity because of a high resistance.

Second Example To Compare

A laminated structure consisting of non-doped GaN and Mg-doped GaN was manufactured in the same manner as in the first embodiment, except for points that hydrogen was added 50 SCCM during cooling down of crystal after growing the crystal. Carrier concentration of the sample was $3 \times 10^{14}$ $cm^{-3}$ when evaluated in the same manner as in the first embodiment.

SECOND EMBODIMENT

After growing non-doped GaN to a thickness of 3 $\mu m$ using hydrogen as the carrier gas, supply of TMG was stopped, the carrier gas was changed to nitrogen, and the substrate was cooled down to a temperature of 800° C., as in the first embodiment. Next, using TEG, TMI and TEA as materials, $In_{0.15}Ga_{0.85}N$ was grown to a thickness of 50 Å and $Ga_{0.8}Al_{0.2}N$ was grown to a thickness of 300 Å. Further, the temperature of the substrate was increased to 1,100° C. while supplying only nitrogen, i.e., the carrier gas, and ammonia, so as to grow Mg-doped GaN to a thickness of 5,000 Å, in the same manner as in the first embodiment. After growing Mg-doped GaN, the substrate was cooled down and taken out as in the first embodiment except for the point that the supply of $NH_3$ was stopped when the temperature of the susceptor was reduced to 600° C., and the carrier concentration was measured. Measurement showed that the conductivity was p-type and the concentration was $1.5 \times 10^{18} cm^{-3}$.

THIRD EMBODIMENT

Figure 3:
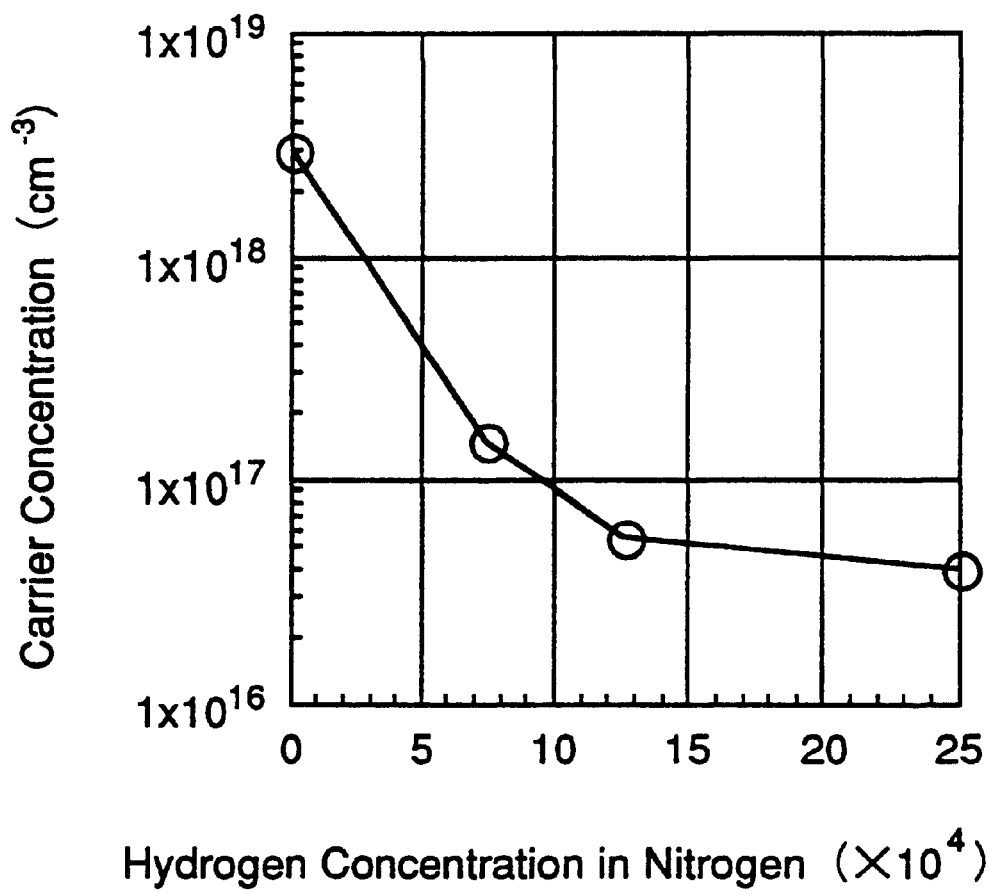
FIG. 3 is a graph showing the relationship between the carrier concentration of the samples produced in the second and the third Embodiments and the hydrogen concentration in the carrier gas.

Three samples were produced as in the second embodiment except for the points that the InGaN layers were not grown and that 3, 5, and 10 SCCM of hydrogen was added in the nitrogen carrier gas. The values of carrier concentration of these samples were $1.5 \times 10^{17}$, $5.5 \times 10^{16}$, and $4 \times 10^{16} cm^{-3}$, respectively. The relationship between the carrier concentration of the samples produced in the second and the third embodiments and the hydrogen concentration in the carrier gas is shown in FIG. 3.

According to the present invention, it is possible to grow a nitrogen-contained Group III-V compound semiconductor of the p-type conductivity, without performing any particular post-processing after growing the compound semiconductor, and hence to prevent a deterioration in the yield of manufacturing light emitting elements due to post-processing. Further, an active layer can be grown at a lower temperature on a p-type layer, which serves to reduce a restraint to the structure of a light emitting element.

While the invention has been described in detail, the foregoing description is in all aspects illustrative and not restrictive. It is understood that numerous other modifications and variations can be devised without departing from the scope of the invention.

What is claimed is:

1. A method of manufacturing a Group III-V compound semiconductor which contains Group II elements as p-type impurities and which is expressed by a general formula $In_xGa_yAl_zN$ ($0 \leq x \leq 1$, $0 \leq y \leq 1$, $0 \leq z \leq 1$, x+y+z=1) which comprises conducting thermal decomposition by a vapor phase method using metalorganics, wherein the carrier gas is an inert gas in which the concentration of hydrogen is 0.5% or smaller by volume, and the concentration of hydrogen is maintained at 0.5% or smaller by volume in an atmosphere, during a reduction in temperature of the Group III-V compound semiconductor after the Group III-V compound semiconductor is grown.

2. A method of manufacturing a Group III-TV compound semiconductor which contains Group II elements as p-type impurities and which is expressed by a general formula $In_xGa_yAl_zN$ ($0 \leq x \leq 1$, $0 \leq y \leq 1$, $0 \leq z \leq 1$, x+y+z=1) which comprises conducting thermal decomposition by a vapor phase method using metalorganics, wherein after etching within a reaction furnace using at least one compound which is selected from a group consisting of compounds of halogenated hydrogen, compounds of halogen and Group V elements, and compounds of halogen, hydrogen and Group V elements, and inert gas is used, wherein the inert gas has a concentration of hydrogen of 0.5% or smaller by volume, and the concentration of hydrogen is maintained at 0.5% or smaller by volume in an atmosphere, during a reduction in temperature of the Group III-V compound semiconductor after the Group III-V compound semiconductor is grown.

3. The method of manufacturing a Group III-V compound semiconductor of claim 1, wherein the concentration of hydrogen is 0.3r less by volume.

4. The method of manufacturing a Group III-V compound semiconductor of Claim 1, wherein the concentration of hydrogen is 0.1% or less by volume.

5. The method of manufacturing a Group III-V compound semiconductor of claim 1, wherein the concentration of hydrogen is 0.04% or less by volume.

6. The method of manufacturing a Group III-V compound semiconductor of claim 2, wherein the concentration of hydrogen is 0.3% or less by volume.

7. The method of manufacturing a Group III-V compound semiconductor of claim 2, wherein the concentration of hydrogen is 0.1% or less by volume.

8. The method of manufacturing a Group III-V compound semiconductor of claim 2, wherein the concentration of hydrogen is 0.04% or less by volume.

9. The method of manufacturing a Group III-V compound semiconductor of claim 1, wherein the method further comprises employing a material gas and a substrate, and if two or more inlets are used for introducing carrier gas and/or material gas, a maximum angle between any two of the inlets and any point on the substrate is about 80 degrees or smaller.

10. The method of manufacturing a Group III-V compound semiconductor of claim 2, wherein the method further comprises employing a material gas and a substrate, and if two or more inlets are used for introducing carrier gas and/or material gas, a maximum angle between any two of the inlets and any point on the substrate is about 80 degrees or smaller.

11. The method of manufacturing a Group III-V compound semiconductor of claim 9, wherein an angle between any two of the inlets and any point on the substrate is 70 degrees or smaller.

12. The method according to claim 1, wherein said p-type impurities are Be, Mg, Zn, Cd, or Hg.

13. The method according to claim 2, wherein said p-type purities are Be, Mg, Zn, Cd, or Hg.

14. The method according to claim 1, wherein said p-type impurity is Mg.

* * * * *